May 29, 1956 R. M. BAKER ET AL 2,748,242

TANK CIRCUIT

Filed March 14, 1951

WITNESSES:

INVENTORS
Taylor A. Birckhead
and Robert M. Baker.
BY
ATTORNEY

United States Patent Office 2,748,242
Patented May 29, 1956

2,748,242

TANK CIRCUIT

Robert M. Baker and Taylor A. Birckhead, Baltimore, Md., assignors to Westinghouse Electric Corporation, East Pittsburgh, Pa., a corporation of Pennsylvania Application March 14, 1951, Serial No. 215,592

2 Claims. (Cl. 219—10.77)

Our invention relates to impedance matching, and in particular to the provision of a simple output tuning system for matching a load to a radio frequency generator.

In radio frequency heating applications, in particular dielectric heating applications, it is very desirable that the impedance of the output load circuit be matched to the radio frequency generator which is supplying power to it. Proper impedance matching assures the most efficient power transfer to the load. If the normal impedance of the load properly match the supply generator, no matching network would be needed. However, in practically all cases some kind of matching network is needed to convert the voltage and current available at the output tank circuit of the supply generator into the voltage and current needed through the load circuit to cause the correct amount of heat to be generated in the work. In some cases the work is located close to the tank circuit; in others it may be located a considerable distance away. It is generally a problem to properly design a simple output tuning system to effect this desirable impedance matching, particularly for the industrial heating of dielectric materials. This is because of the very wide range of load impedances which are presented as the dielectric material is heated, and also due to the dielectric effect of the different physical dimensions of dielectric material which it is desirable to heat with a given heating apparatus.

In accordance with the prior art of which we are aware, the most satisfactory previous arrangement for impedance matching appeared to be the use of a variable inductance which is connected in series with the dielectric load electrodes and is connected to a tap on the tank coil of the supply generator. However, as the load impedances becomes rather large, the series connected variable inductance requires such a wide range of inductive variance to effectively match the load to the supply generator that rather expensive coils and rotating elements, which usually involve moving contact problems, become necessary. In the normal operation of particularly industrial heating apparatus, the effective capacitance of the load between the heating electrodes varies over a considerable range, in the nature of 20:1. This has necessitated in the prior art the provision of an additional tapped variable inductance in series with the aforesaid variable inductance, the two such variable inductances being placed in series with the load. The tapped variable inductance has become necessary to allow the first variable inductance to effectively tune the circuit into the desirable resonant operating condition. A tapped inductance alone is very difficult to adjust for fine tuning of the load circuit, and cannot be varied when the apparatus is in actual operation; therefore, the variable inductance is required. For particularly high impedance loads, the required inductance which is placed in series with the load becomes very large, the tapped second variable inductance effectively becomes a very high percentage of the total inductance and the variable tuning first inductance becomes a very small percentage of the total series inductance.

Accordingly, it is an object of our invention to provide a simplified output tuning system for use with an industrial heating circuit.

It is another object of our invention to facilitate the proper loading and impedance matching of a radio frequency generator into a very wide range of effective load impedances.

It is still another object of our invention to make unnecessary the use of a trolley type variable inductance in series with the load circuit.

It is a further object of our invention to make unnecessary the use of a variable tank capacitor to accomplish frequency tuning of the load circuit.

It is a further object of our invention to provide an output tuning system which is frequency tuned to effect the most desirable dielectric load matching respecting the radio frequency supply generator.

In accordance with our invention, a single tapped variable inductance is series connected with the dielectric heating electrodes in the output load circuit. In addition to the inductive frequency determining element in the resonant tank circuit of the radio frequency power supply generator, there is provided a variable inductance which is also provided with a plurality of taps. The output load circuit is connected to one of these taps across only a portion of the latter tank inductance. As the load capacitance varies, the combined load circuit, comprising the capacitance of the dielectric load and the inductance of the series connected tapped variable inductance, is approximately series resonated such that a maximum load current is thereby obtained. However, the load circuit at this time is not fully tuned, but is tuned, to a frequency near the operating frequency of the supply generator at the time of such tuning, with the tapped series inductance within the limits of the closest inductance change available by the stepped tuning of the tapped series inductance in the load circuit. The variable tank inductance is then employed to change the operating frequency of the supply generator to the actual series resonant frequency of the combined load circuit, comprising the series connected tapped variable inductance and load capacitance. In this way the voltage across the dielectric load is brought up to the desired level or the maximum obtainable from the system.

The novel features that we consider characteristic of our invention are set forth with particularity in the appended claims. The invention, itself, however, both as to its organization and its method of operation, together with additional objects and advantages thereof, will best be understood from the following description of specific embodiments, when read in conjunction with the accompanying drawing, in which:

Figure 1:
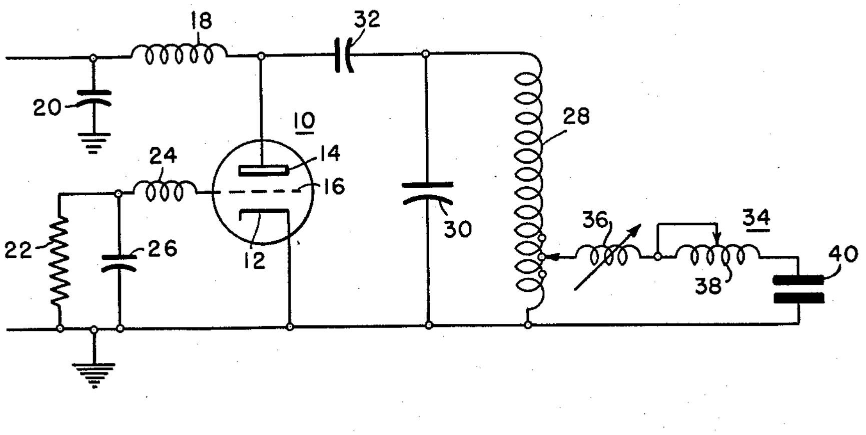
Figure 1 is a schematic diagram of the prior art output tuning systems.

In Fig. 1 there is shown a triode tube oscillator 10 connected through the prior art tuning system for matching the load circuit. The triode has a cathode 12, a plate 14 and a grid 16. The plate 14 is connected to a suitable plate voltage supply (not shown) through an RF choke coil 18 with a by-pass capacitor 20 connected between the plate voltage supply and ground. The grid 16 is connected to ground through a bias resistor 22 and a grid inductor 24. A by-pass capacitor 26 shunts the bias resistor 22. The cathode 12 is connected to ground. The output tank circuit for said oscillator 12 comprises a parallel connected inductance 28 and capacitance 30, which are connected through a D. C. blocking capacitor 32 to the plate 14. The tank inductor 28 is provided with a plurality of taps, one of which is connected to the load circuit 34. The load circuit 34 comprises a first variable inductor 36 and a second tapped variable inductor 38 and a dielectric load 40 connected in series.

Figure 2:
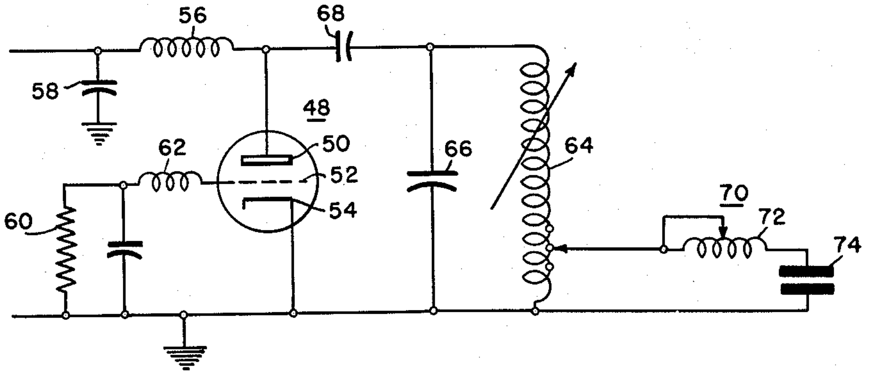
Fig. 2 is a schematic diagram of our proposed simplified output tuning system.

In Fig. 2 is shown our simplified output tuning system. A radio frequency oscillator 48, comprising a triode having a plate 50, grid 52 and cathode 54, is provided. The plate 50 is connected through a choke coil 56 to a suitable plate voltage supply (not shown). A radio frequency by-pass capacitor 58 is connected between ground and the plate voltage supply. The grid 52 is connected to ground through a bias resistor 60 and a grid inductance 62. A by-pass condenser shunts the bias resistor 60. The cathode 54 is connected to ground. An output tank circuit, comprising a parallel connected tank inductor 64 and capacitor 66, is connected to the plate 50 through a D. C. blocking condenser 68. The tank inductor 64 is variable, and is also provided with a plurality of taps. To one of the latter taps is connected the load circuit 70, which comprises a series connected tapped variable inductor 72 and the dielectric load 74.

In the operation of the apparatus shown in Fig. 1, the dielectric load material is heated between the load electrodes 40. In actual practice the impedance of the effective loads may vary over a wide range. This range may be as great as 20:1. For example, the capacitance of the load circuit, due to different loads, may vary between 50 micro-microfarads and 1000 micro-microfarads. To effectively tune the load circuit such that these different load impedances can be most effectively matched to the supply generator, the tapped variable inductance 38 may be varied, within the limits of its respective taps, to approximately tune the load circuit 34. The first variable inductance 36 is then varied to properly tune the load circuit 34 to the operating frequency of the supply oscillator 10. The tapped second inductance 38 is necessary to bring the load circuit 34 within the tuning range of the variable first inductance 36 for resonating the series load circuit 34. This is particularly objectionable for high impedance loads, because the required series inductance in the load circuit 34 becomes very large, and the limited maximum inductance of the first variable inductor 36 becomes a very small percentage of the total required series inductance in the load circuit 34.

In the operation of the apparatus shown in Fig. 2, the tank circuit, comprising the parallel connected inductor 64 and capacitance 66, determines the operating frequency of the radio frequency supply oscillator 48. This tank circuit inductance 64 is both variable and provided with a plurality of output taps. The load circuit 70 is connected to one of these latter provided taps. As the load impedance changes, due to either a change in the physical dimensions of the load material or due to the heating effect on the load material, the load circuit 70 can be approximately brought into resonance by means of the series connected tapped inductor 72. The limits of the latter tuning are determined by the provided steps on the series connected tapped inductor 72. Then the variable inductor 64 in the tank circuit, which requires a comparatively small inductive range and is obtainable from relatively inexpensive apparatus, can be employed to vary the generated frequency of the supply oscillator 48 as may be required for final tuning to provide the necessary voltages across the material being dielectrically heated.

The load circuit 70 tuning, as above described, is readily accomplished by the apparatus of Fig. 2 for very high impedance loads or for very low impedance loads. This follows from the fact that the resonance curve of a series circuit (voltage vs. frequency) is not critically dependent upon absolute values of capacity and inductance but only on how near to resonance the circuit is operating.

Although we have shown and described certain specific embodiments of our invention, we are fully aware that many modifications thereof are possible. Our invention, therefore, is not to be restricted, except insofar as is necessitated by the prior art and by the spirit of the appended claims.

We claim as our invention:

1. In apparatus for heating a dielectric load, the combination of a radio frequency generator, a pair of heating electrodes between which said load can be placed for heat treatment, a frequency-determining tank circuit for the generator comprising a parallel-connected capacitance and a first inductance, said first inductance including two sections, one of the sections being variable and the other section having a plurality of taps adapted for connection to a load circuit, and a load circuit connected to one of said taps, said load circuit including a second inductance which is variable and connected in series with said heating electrodes, whereby the load circuit can be initially tuned to series resonance by means of the second inductance and until a maximum load current is thereby obtained, and the first inductance can be then employed to vary the operating frequency of the generator to the series resonant frequency of the load circuit.

2. In apparatus for supplying power to a variable capacitance load, the combination of a radio frequency generator, a pair of heating electrodes between which the load can be placed for heat treatment, a frequency-determining tank circuit for said generator comprising a parallel-connected capacitance and first inductance, the first inductance including two sections, one of which is variable and the other having a plurality of taps, with each of said taps being adapted for connection to a load circuit, a load circuit connected to one of said taps and including a second inductance which is variable and series connected with said heating electrodes, whereby as compensation for the load capacitance changes due to the effect of the heat treatment thereon, the load circuit can be initially tuned to series resonance by means of the second inductance, and then the first inductance can be employed to vary the frequency of the generator such that a predetermined voltage can be thereby provided between the heating electrodes.

References Cited in the file of this patent

UNITED STATES PATENTS

| | | |
|---|---|---|
| 1,977,397 | Morel | Oct. 16, 1934 |
| 2,416,172 | Gregory | Feb. 18, 1947 |
| 2,467,285 | Young | Apr. 12, 1949 |
| 2,467,782 | Schuman | Apr. 19, 1949 |
| 2,470,443 | Mittelmann | May 17, 1949 |
| 2,472,820 | Graham | June 14, 1949 |

FOREIGN PATENTS

| | | |
|---|---|---|
| 617,287 | Great Britain | Feb. 3, 1949 |